(12) United States Patent
Tran et al.

(10) Patent No.: US 7,285,948 B2
(45) Date of Patent: *Oct. 23, 2007

(54) METHOD AND APPARATUS PROVIDING SINGLE CABLE BI-DIRECTIONAL TRIGGERING BETWEEN INSTRUMENTS

(75) Inventors: Que Thuy Tran, Beaverton, OR (US); Dennis Keldsen, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/734,448

(22) Filed: Dec. 12, 2003

(65) Prior Publication Data

US 2004/0124848 A1 Jul. 1, 2004

Related U.S. Application Data

(60) Provisional application No. 60/434,265, filed on Dec. 17, 2002.

(51) Int. Cl.
*G01R 31/28* (2006.01)
*G01R 31/26* (2006.01)

(52) U.S. Cl. .................................. 324/158.1; 324/765

(58) Field of Classification Search ............ 324/121 R, 324/719, 76.11, 76.19, 76.22, 76.41; 702/66–68, 702/117, 118, 121, 124, 125; 341/122–123, 341/155

See application file for complete search history.

(56) References Cited

U.S. PATENT DOCUMENTS 5,180,971 A * 1/1993 Montijo ................. 324/121 R
6,060,878 A * 5/2000 Doi ......................... 324/76.27
6,121,799 A * 9/2000 Moser ......................... 327/58
6,219,029 B1 * 4/2001 Flakne et al. ............... 345/690
6,628,112 B2 9/2003 Pisipaty ................... 324/76.53
6,693,576 B2 * 2/2004 Azinger ..................... 341/155
6,812,688 B2 * 11/2004 Tan et al. ............... 324/121 R
6,832,174 B2 * 12/2004 Tran et al. ............... 324/76.38
2003/0220753 A1 * 11/2003 Pickerd et al. .............. 702/67
2003/0231187 A1 * 12/2003 Dobyns et al. ............. 345/619
2004/0013176 A1 * 1/2004 Gerlach et al. ............. 375/211
2004/0117138 A1 * 6/2004 Tran et al. ................... 702/66
2004/0117143 A1 * 6/2004 Tran et al. .................. 702/121
2004/0119620 A1 * 6/2004 Tran et al. .................. 341/126
2004/0124848 A1 7/2004 Tran et al. .................. 324/543
2004/0174818 A1 * 9/2004 Zocchi ........................ 370/241

OTHER PUBLICATIONS

Book: The Art Of Electronics, Paul Horowitz, Winfield Hill, Second Edition, Cambridge University Press, 1980 and 1989, Chapter 11, Microprocessor Support Chips, 11.10, p. 801.

* cited by examiner

*Primary Examiner*—Jermele Hollington
(74) *Attorney, Agent, or Firm*—Thomas F. Lenihan; Moser, Patterson, Sheridan LLP

(57) ABSTRACT

System and apparatus enabling the use of a single cable to communicate triggering information between each of a plurality of signal acquisition devices and, illustratively, an external trigger control unit. A combined tripper signal is produced only when each tripper condition of each signal acquisition device is true. Thus, all of the signal acquisition devices will be triggered substantially simultaneously.

10 Claims, 6 Drawing Sheets

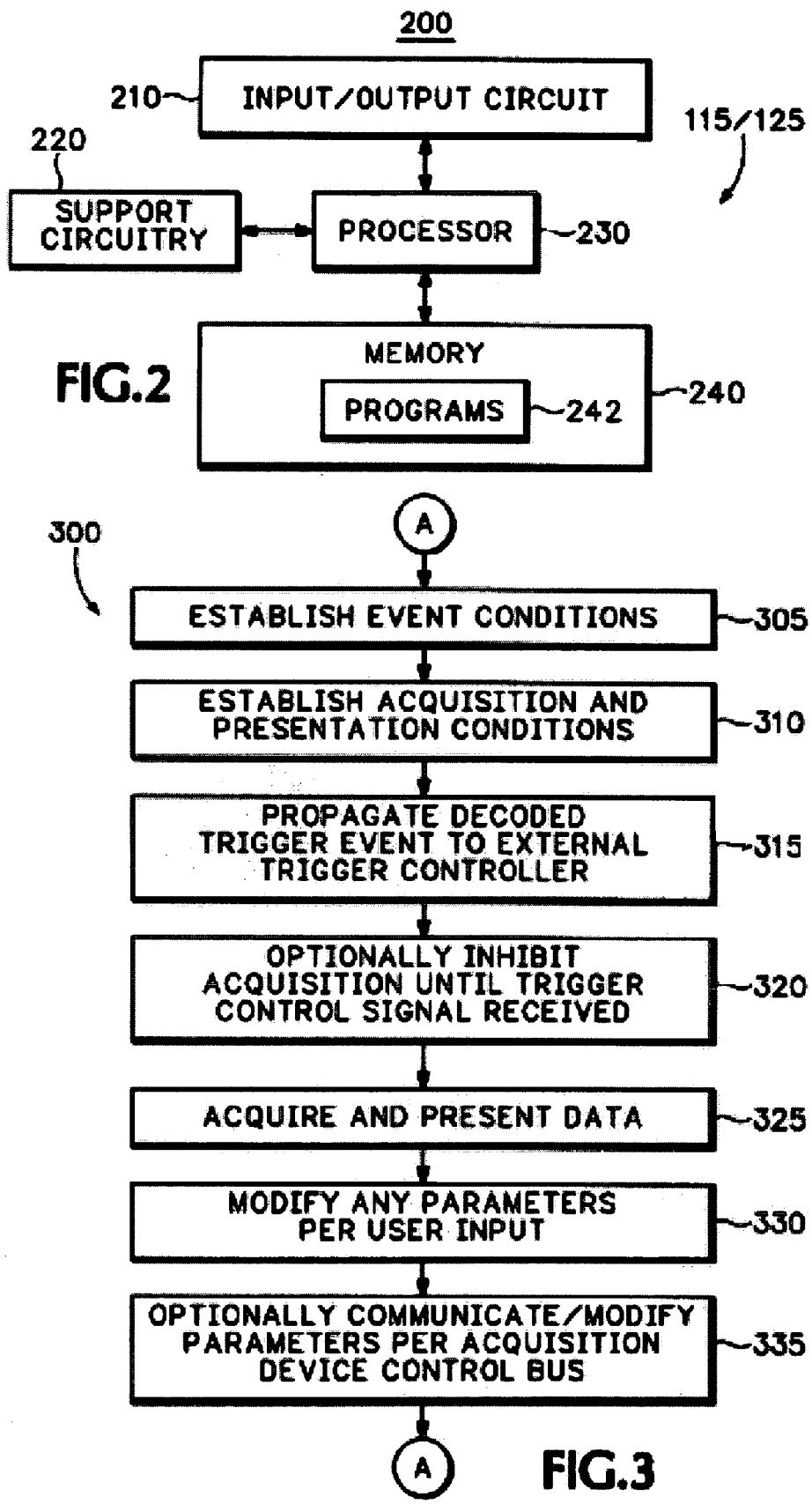

US 7,285,948 B2

METHOD AND APPARATUS PROVIDING SINGLE CABLE BI-DIRECTIONAL TRIGGERING BETWEEN INSTRUMENTS

CROSS REFERENCE TO RELATED APPLICATIONS

This application claims the benefit of U.S. Provisional Application No. 60/434,265, filed Dec. 17, 2002.

FIELD OF THE INVENTION

The invention relates generally to signal analysis instruments and, more specifically, to a method and apparatus for providing single cable bi-directional triggering between multiple instruments.

BACKGROUND OF THE INVENTION

Signal acquisition devices such as digital storage oscilloscopes (DSOs) and the like typically include a triggering means by which the display or acquisition of a signal under test (SUT) may be synchronized to a specific event or events. A DSO, for example, may include means for operationally combining a plurality of trigger input conditions to produce a compound trigger event. For example, in a four channel DSO, where each of the four input channels includes respective trigger processing circuitry, four respective channel trigger signals may be logically processed (e.g., ANDed) together to produce a compound trigger signal. The compound trigger signal may then be applied to one or more of the input channels to acquire data of a specific type. DSOs also provide a full range of analog triggering functions such as, rising edge, pulsewidth, and runt triggering.

Unfortunately, there is at present no capability to derive a compound trigger condition utilizing more than the available number of channels on a particular instrument. Moreover, to the extent that trigger signals are communicated between instruments, many individual cables are necessary to achieve such communication.

What is needed is an apparatus and method to accomplish the above, without subjecting the user to the complexities of coupling multiple trigger signal cables to each instrument.

SUMMARY OF INVENTION

These and other deficiencies of the prior art are addressed by the present invention of a system and apparatus enabling the use of a single cable to communicate triggering information bi-directionally between each of a plurality of signal acquisition devices and, illustratively, an external trigger control unit.

The subject invention is adapted, in one embodiment, to an apparatus comprising an event decoder, for monitoring at least one input signal to determine whether a particular logical or analog triggering event has occurred; and a transceiver, for transmitting indicium of the occurrence of the logical triggering event (a trigger enable signal) and for receiving a trigger signal, wherein the trigger enable signal and the trigger signal are conveyed in opposite directions over a single cable.

BRIEF DESCRIPTION OF THE DRAWINGS

The teachings of the present invention can be readily understood by considering the following detailed description in conjunction with the accompanying drawings, in which:

FIG. 2 depicts a high-level block diagram of a controller suitable for use in the signal analysis system of FIG. 1;

FIG. 3 depicts a flow diagram of a method according to an embodiment of the present invention;

To facilitate understanding, identical reference numerals have been used, where possible, to designate identical elements that are common to the figures.

DETAILED DESCRIPTION OF THE INVENTION

The subject invention will be primarily described within the context of test and measurement devices such as a plurality of digital storage oscilloscopes (DSOs). However, it will be appreciated by those skilled in the art that the invention may be advantageously employed in any environment where multiple signal analysis devices having respective triggering functions or trigger event decoding functions (e.g., logic analyzers) are desired to process signals under test.

Figure 1:
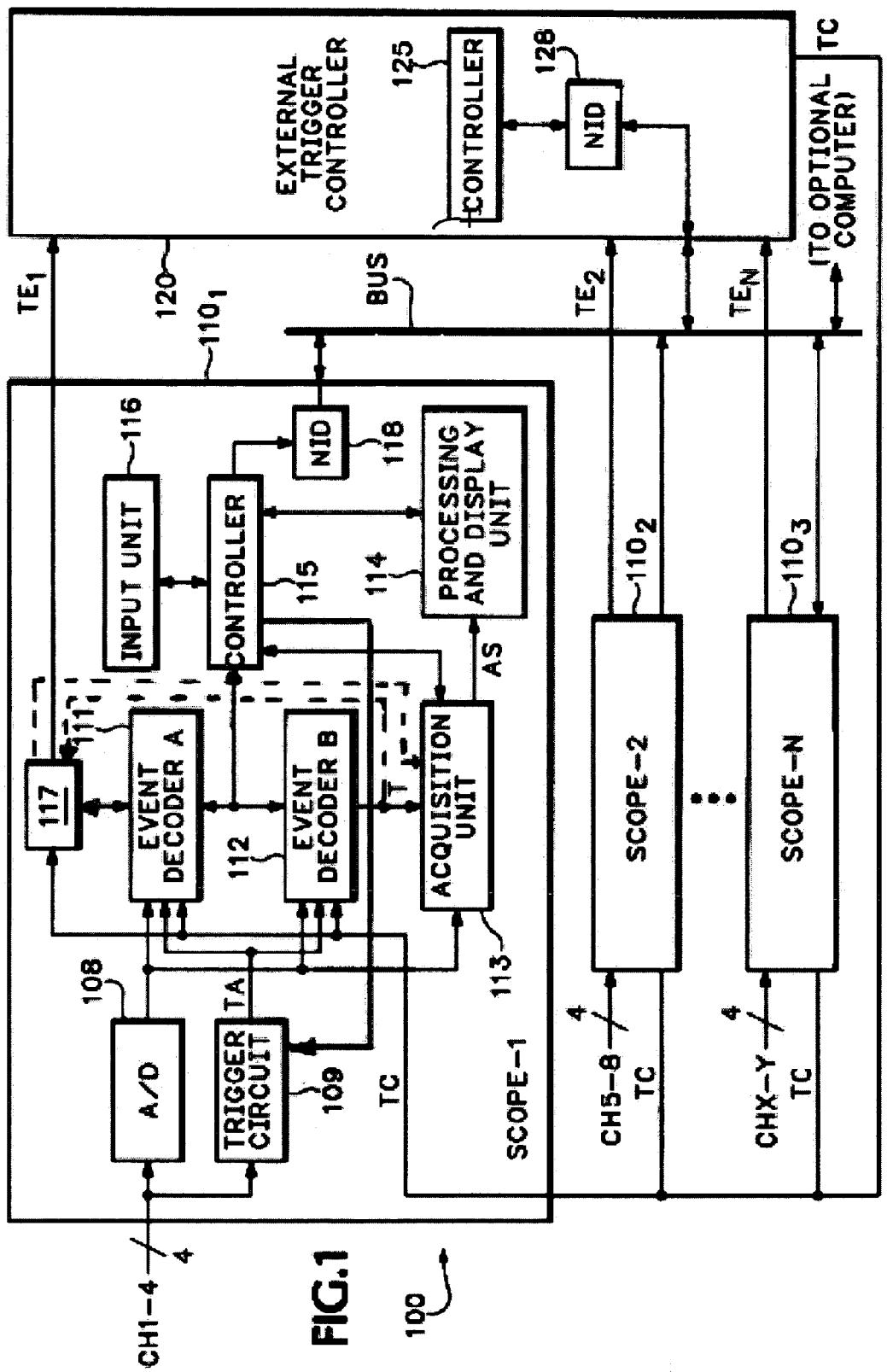
FIG. 1 depicts a high-level block diagram of a signal analysis system according to an embodiment of the invention.

FIG. 1 depicts a high-level block diagram of a data acquisition system according to an embodiment of the present invention. Specifically, the system 100 of FIG. 1 comprises a plurality of signal or data acquisition devices (i.e., test and measurement instruments) such as digital storage oscilloscopes (DSOs), logic analyzers and the like denoted as acquisition devices $110_1$, $110_2$, and so on up to $110_N$ (collectively acquisition devices 110). Each of the acquisition devices 110 comprises, illustratively, a four channel DSO, though more or fewer channels may be used for any or all of the acquisition devices 110. Moreover, more or fewer acquisition devices may be used and, in various embodiments, different types of acquisition devices may be used.

A first acquisition device $110_1$ receives data from a first four respective input channels CH1–4, a second acquisition device $110_2$ receives data from a respective second four input channels CH5–8 and so on up to an $N^{th}$ acquisition device $110_N$ receiving data from a respective $N^{th}$ four input channels CHX–Y.

Each of the acquisition devices $110_1$ comprises a first event decoder 111, a second event decoder 112, an acquisition unit 113, a processing and display unit 114, a controller 115, an input unit 116, an optional trigger logic unit 117 and an optional network interface device (NID) 118. Assuming a four channel DSO embodiment, and referring to first acquisition unit $110_1$, each of the four CH1–4 input signals under test (SUT) is coupled to the first event decoder 111, second event decoder 112 and acquisition unit 113. A digitizer (A/D converter) 108 receives analog signals under test and provides digitized samples to the circuitry described above. In addition, an analog trigger circuit 109 receives the analog signals under test and provides a trigger output signal TA to the first 111 and second 112 event decoders upon detection of a preselected analog signal condition. Such analog signal conditions may include detection of rising edge, falling edge, pulsewidth, period, glitch, and runt, to name but a few. The analog trigger circuit 109 is optionally controlled (e.g. selection of analog signal condition, trigger logic and the like) by the controller 115.

The acquisition unit 113 comprises, illustratively, at least one decimator for each of the four input signals as well as supporting acquisition memory. The acquisition unit 113 is responsive to a trigger signal T provided by the second event decoder 112 to produce an acquired sample stream AS suitable for use by the trigger logic unit 117. The acquisition unit 113 is optionally responsive to the controller 115 to change decimator functions, memory allocations and other functions as appropriate, and as appreciated by those skilled in the art informed by the present disclosure. The acquisition unit may also communicate acquired data, such as the acquired sample stream AS, to the controller 115 for processing or further communication to the optional NID 118.

The processing and display unit 114 comprises, illustratively, a display device (not shown) and associated data processing circuitry suitable for converting the acquired sample stream AS into visual imagery. The processing and display unit 114 is responsive to the controller 115 to set various parameters such as volts per division, time scale and the like. It will be appreciated by those skilled in the art that within the context of a data acquisition system utilizing many acquisition devices 110, it is not necessary to include a processing and display unit 114 in each of the acquisition devices. Moreover, in the case of acquisition devices 110 comprising modules or cards inserted within a computing device or arranged using a back plane, a single processing and display unit 114 may provide an image processing function for any one (or more) of the acquisition devices 110.

The input unit 116 comprises a keypad, front panel controls, pointing device, or other means adapted to provide user input to the controller 115. The controller 115, in response to such user input, adapts the operations of the data acquisition unit 110 to perform various data acquisition, triggering, processing, display and other functions. In addition, user input may be used to trigger automatic calibration functions and/or adapt other operating parameters of a DSO, logic analysis or other data acquisition device. Such input may also be provided to the controller 115 via a communications link operably coupled to the optional NID 118.

It will be appreciated by those skilled in the art that standard signal processing components (not shown) such as signal buffering circuitry, signal conditioning circuitry and the like are also employed as appropriate to enable the various functions described herein.

The first event decoder 111 processes one or more of the received input channel data streams CH1–4 according to a combinational and/or sequential logic function to determine whether a predefined triggering condition exists. For example, the first event decoder 111 may be programmed by the controller 115 to examine all or some of the four input channels data streams CH1–4 to determine whether a triggering event such as a desired sequence of logic levels indicative of a portion of a data word or the like has been received. As noted above, event decoder also receives from analog trigger circuit 109 an indication that an analog trigger condition has been detected. In response to the determination or decoding of a desired triggering event, a trigger enable signal TE is generated. Each of the acquisition devices $110_1$ through $110_N$ produces a respective trigger enable signal $TE_1$ through $TE_N$. Each of the produced trigger signals $TE_1$ through $TE_N$ is coupled to an external trigger controller 120. Thus, logical event indicative signals associated with each (or at least some) of the input signals are provided to the external trigger controller 120 for further processing.

The external trigger controller 120 processes the received trigger signals $TE_1$ through $TE_N$ to determine whether a desired combined trigger condition is met. Such processing may comprise any combinational and/or sequential logic processing of the trigger signals, such as conventional logic processing (AND NAND, XOR, etc.). In response to the satisfaction of the desired combined trigger condition, the external trigger controller 120 produces a trigger control signal $T_c$ having a defined state, logic level, waveform and the like which is coupled to one or more of the data acquisition devices 110 in oscilloscopes 1 to N. The external trigger controller 120 is depicted as including a controller 125. The controller 125 may implement any combinational or sequential logic processing operation desired. Moreover, the controller 125 may communicate with the optional communications bus via an optional NID 128. It is noted that the external trigger controller 120 may comprise a single ASIC programmed to perform the specific combinational/sequential logic function of combining the various trigger enable inputs $TE_1$ through $TE_N$ to produce the trigger control signal $T_c$.

The trigger control signal $T_c$ is received at one or both of the first 111 and second 112 event decoders within an acquisition device 110. The second event decoder 112 is responsive to the decoding or detection of a triggering event based upon the sequential or combinational state of its respective input channels as well as detection of analog signal conditions. In response to the sequential or combinational state of the trigger control signal $T_c$, the second event decoder produces a trigger signal T used to control the acquisition unit 113.

The above-described system 100 of FIG. 1 provides for a plurality of data acquisition devices 110, where each acquisition device provides a respective trigger signal determined according to the decoding or detection of sequential and/or logical conditions of its respective input channels. The external trigger controller 120 aggregates or combines the trigger enable signals $TE_1$ through $TE_N$ produced by the data acquisition devices $110_1$ through $110_N$ to produce a combined trigger control signal $T_c$. The combined trigger control signal $T_c$ is then used by each of the data acquisition devices 110 to control its respective acquisition function. In this manner, a trigger condition having sequential or combinational logic characteristics that exceed the capabilities of any one instrument, such as a DSO or other data acquisition device is realized. For example, a user may suspect that his system under test may be experiencing problems only under certain conditions. In this example those conditions are a "runt" (i.e., less than full amplitude) signal occurring when his eight data lines are in the state 10100101. Thus, the user will preprogram external trigger controller 120 to generate a combined trigger only when both of the above conditions are true. Note that all eight data lines (four from each of two oscilloscopes) are logically combined and further combined with the detection of an analog trigger condition (i.e., runt), an outcome heretofore not possible.

It is important to note that although a particular instrument detects or decodes some or all of the trigger criteria, it does not immediately begin acquiring data samples, but rather is substantially simultaneously triggered for data acquisition along with all of the other instruments.

The combined trigger signal $T_c$ allows synchronization of the plurality of data acquisition devices 110. It is herein noted that in order to realize such synchronization, a calibration procedure must be used to determine the delay time between when the trigger enable TE signal is generated and when the trigger signal TC is received (i.e., the "roundtrip" time of the trigger signal). In such a procedure external trigger controller 120 is instructed to immediately generate trigger signal in response to receipt of a trigger enable signal without trying to combine the trigger enable signal with any other trigger enable signal. Then, each instrument in turn sends a calibration trigger enable signal to external trigger controller 120 and measures the time until a trigger signal is received from external trigger controller 120. For example, a first test and measurement instrument may record a roundtrip time of 1.2 ns (nanoseconds), and second instrument may record a roundtrip time of 1.4 ns, and a third instrument may record a roundtrip time of 1.6 ns. Such differences in delay time may be a function of cable length between the instrument and external trigger controller 120. It is important that the trigger enable signals are received at external trigger controller 120 substantially simultaneously, so that that may be correctly logically combined. Clearly, the third test and measurement instrument cannot trigger in advance to make up the time difference. Thus, the first and second test and measurement instruments must delay the generation of their trigger enable signals by one half of the difference between their respective roundtrip times and the roundtrip time of the third test and measurement instrument in order to coincide with the trigger enable signals of the third instrument. Such a solution requires that each instrument "know" the delay times of the others, and indeed, the calibration procedure calls for communication of those delay times to all other instruments in the group (via GPIB, or other form of LAN, for example).

In one embodiment of the invention, an optional trigger logic unit 117 is used to process the trigger signal T produced by the second event decoder 112. In this embodiment, the trigger logic unit (providing a combinational and/or sequential logic function) receives the trigger signal T produced by the second event decoder 112 as well as the trigger control signal TC produced by the external trigger controller 120. The trigger logic unit 117 responsively produces a gated trigger signal T' which is coupled to the acquisition unit 113. In one embodiment of the invention, the trigger logic unit 117 has a logical function defined by the controller 115. In this embodiment, the controller 115 communicates with the trigger logic unit 117 to effect any changes in the combinational and/or sequential logic profile of the trigger logic unit 117. Such changes may be appropriate in the case of adapting system operation parameters to specific signals under test, attempting to synchronize various acquisition devices 110 and the like.

In one embodiment of the invention, the controller or either event decoder enables the assertion (i.e., trigger or ready to trigger) of a trigger signal only when the acquisition unit 113 is able to acquire data and/or the processing and display unit 114 is able to further process acquired data The acquisition unit 113 utilizes the gated trigger signal T' in substantially the same manner as described above with respect to the trigger signal T. In this manner, where each of a plurality of acquisition devices 110 utilizes a similar gated triggering mechanism, each of the respective acquisition units 113 of the acquisition devices 110 will be triggered at the same time and in response to the same decoded event. This is useful since each instrument or acquisition device 110 may acquire data at different times if the combined trigger event rate is higher than the slowest acquisition rate, because record length, hold off time, processing time and the like of each instrument or acquisition device may be different. These differences in each instrument or acquisition device 110 may cause each instrument or acquisition device 110 to be ready for the trigger condition at different times. By utilizing the sequential triggering mechanism enabled by the trigger logic unit 117, each instrument or acquisition device 110 sends its decoded trigger event (from its first event decoder 111) only when it is ready to trigger. In this manner, the resulting combined event or triggering condition provided by the external trigger controller 120 occurs only when all acquisition devices 110 are ready to trigger. Thus, when the combined triggering event occurs, all acquisition devices will trigger on the particular event. When any one instrument or acquisition device 110 is triggered, it will go back to a "not ready to trigger" state to mask out the decoded event to the external trigger controller 120. Therefore, each of the instruments or acquisition devices 120 will then wait for all of the instruments or acquisition devices to do their respective post-acquisition processing functions prior to the start of the next acquisition cycle.

In one embodiment of the invention, an optional network interface device (NID) 118 is used to enable communications between acquisition devices 110 and/or a computer (not shown), such as a personal computer (PC), work station or other computing device including standard components such as keyboard entry means, processing means, display means, memory, input/output and the like. Such a computer may perform part of an automatic test system or data acquisition and processing system. The network interface device 118 enables the controller 115 of an acquisition device 110 to coordinate desired triggering events, presentations of acquired data, acquisition of data and other operating parameters. Additionally, in an embodiment where each of the acquisition devices comprises a card or sub-assembly within a larger acquisition device, a control bus BUS cooperating with network interface devices within each of the acquisition devices 110 enables the optional computer to set the various operational parameters of the acquisition devices and retrieve acquired data from the acquisition devices for subsequent presentation on a display device associated with the optional computer, for data analysis or other applications. The computer and/or acquisition devices 110 may also optionally communicate with a controller 125 within the external trigger controller 120. In this manner, full automation and control of the various acquisition devices 110, external trigger controller 120 and other devices (not shown) communicating via the control bus BUS may be provided. This embodiment of the invention works well for individual acquisition devices, such as a plurality of test or measurement instruments (e.g., digital signal oscilloscopes, logic analyzers and the like) or acquisition modules within an acquisition system or computer.

A DSO or other data acquisition device 110 according to an embodiment of the invention includes a triggering system having the ability to deliver a trigger enable signal TE or other indicium of a decoded or detected triggering event to an external trigger controller independent of the event that it is used to trigger the DSO. Thus, in the data acquisition devices 110 of FIG. 1, first 111 and second 112 event decoders are used. The first event decoder 111 is adapted to decode or otherwise determine that a triggering event has occurred and, further, to provide indicium of that triggering event to the external trigger controller 120. The second event decoder 112 preferably decodes or determines the occurrence of the same triggering event and responsively produces a triggering signal T adapted to control the acquisition unit 113.

In one embodiment of the invention, only the second event decoder 112 is further controlled using the trigger control signal $T_c$ produced by the external trigger controller 120. In this embodiment of the invention, the first event decoder 111 continually indicates the presence or absence of the triggering event, while the second event decoder 112 triggers the acquisition unit 113 in response to both the presence (or absence) of the triggering event ANDed with the state of the trigger control signal $T_c$.

In one embodiment of the invention, a single event decoder is utilized (i.e., the functions of the first 111 and second 112 event decoders are combined). In this embodiment of the invention, a trigger output signal T provided by the combined event decoders is coupled to both the external trigger controller 120 and the acquisition unit 113. Optionally, the trigger signal T is coupled to the external trigger controller 120 and the trigger logic unit 117, such that the trigger logic unit 117 further controls the operation of the acquisition unit 113.

The combined triggering event enabled by the invention may be used to trigger each of the multiple instruments and, thereby, synchronize operation of the instruments. In an alternate embodiment of the invention, acquisition times between instruments having different operational parameters (e.g., acquisition speed, acquisition rate, record length, hold-off time, processing time and the like) are adapted to enable a relatively synchronized data acquisition process across multiple instrument platforms such that resulting acquired data from the various channels in the various instruments may be usefully synchronized and otherwise processed.

FIG. 2 depicts a high level-block diagram of a controller, generally designated 200, suitable for use in a signal analysis system of FIG. 1. Specifically, the controller 200 of FIG. 2 may be employed to implement functions of the controller 115 in an acquisition device 110 and/or the controller 125 in an external trigger controller 120. The controller 200 of FIG. 2 comprises a processor 230 as well as memory 240 for storing various control programs and other programs 242. The processor 230 cooperates with conventional support circuitry 220 such as power supplies, clock circuits, cache memory and the like as well as circuits that assist in executing the software routine stored in the memory 240. As such, it is contemplated that some of the steps discussed herein as software processes may be implemented within hardware, for example as circuitry that cooperates with the processor 230 to perform various steps. The controller 200 also contains input/output (I/O) circuitry 210 that forms an interface between the various functional elements communicating with the controller 115/125. Although the controller 200 of FIG. 2 is depicted as a general purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware or a combination thereof.

FIG. 3 depicts a flow diagram of a method according to an embodiment of the present invention. Specifically, the method 300 of FIG. 3 depicts various steps implemented by hardware and/or software components within an acquisition device 110.

At step 305, the trigger event conditions associated with the event decoders 111, 112 are established. At step 310, the acquisition and presentation conditions associated with the acquisition unit 113 and, optionally, processing and display unit 114 are established. At step 315, a decoded trigger event is propagated to the external trigger controller 120. At step 320, the trigger signal T normally used to trigger the acquisition unit 113 is optionally inhibited until the trigger control signal $T_c$ is received from the external trigger controller 120. At step 325, the acquisition unit 113 acquires appropriate data and, optionally, the processing and display unit 114 present the acquired data. It is noted that in an embodiment of the invention utilizing the communications BUS, the acquired data may also be propagated at this time to other acquisition devices 110 or an optional computer (not shown). At step 330, any parameters are modified in response to user interaction with the input unit 116. At step 335, any parameters are modified in response to communications received via the acquisition device control bus BUS. Steps 305–335 are then repeated.

In one embodiment of the invention, a computing device such as a personal computer (PC) receives signal acquisition devices in each of a plurality of internal slots within an external assembly (e.g., a "rack" of test and measurement devices) in communication with the PC. The computing device also includes an external trigger controller in an additional slot, or performs a logical operation that replicates the function of the previously described external trigger controller. It will be noted that the term "slot" is to be broadly construed as any means of electrical and/or mechanical communication of a signal acquisition device or test and measuring device with the PC. Moreover, the PC discussed herein is to be broadly construed as any computing device or platform having comparable functions, such as an Apple® Macintosh® computer, Sun Microsystems® computing platform and the like. It will be further appreciated that the paths used to route trigger enable and/or trigger control signals between the various components (e.g., scopes 110 and trigger controller 120) may be formed using discrete wiring between the various components or via the bus architecture associated with the PC.

Figure 4:
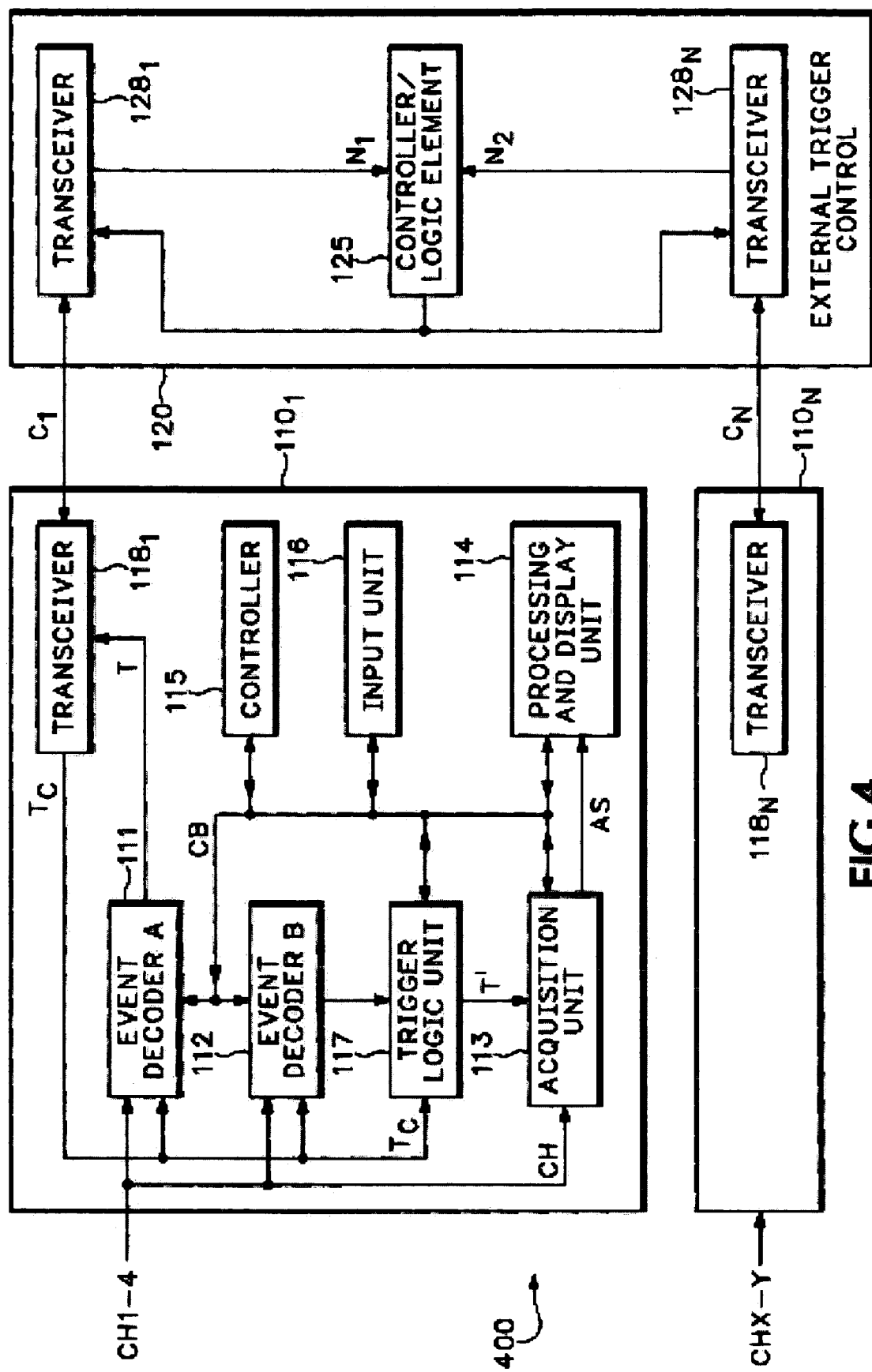
FIG. 4 depicts a high-level block diagram of a signal analysis system according to an embodiment of the invention.

FIG. 4 depicts a high-level block diagram of a signal analysis system according to an embodiment of the invention. Specifically, the signal analysis system 400 of FIG. 4 is similar to the system 100 of FIG. 1 and, as such, only those differences between the systems 100 of FIG. 1 and 400 of FIG. 4 will be discussed in detail.

Note that, in the system 100 of FIG. 1, each of the acquisition devices 110 receives the trigger control signal $T_c$ via a respective external trigger input. In contrast, the system 400 of FIG. 4 does not use conventional external trigger inputs. Rather, the system 400 of FIG. 4 utilizes a bi-directional transceiver to receive external trigger information from the external trigger controller 120, and transmit decoded trigger event indicia to the external trigger controller 120.

Referring to FIG. 4, it is noted that a first $110_1$ acquisition device includes a transceiver $118_1$, an $N^{th}$ acquisition device $110_N$ includes a transceiver $118_N$, and an external trigger control device 120 includes corresponding first $128_1$ and $N^{th}$ $128_N$ transceivers. While the system 400 of FIG. 4 is depicted as including only two acquisition devices, it will be appreciated by those skilled in the art, and informed by the teachings of the present invention, that the system 400 of FIG. 4 may include many (i,.e., N) acquisition devices 110, such as discussed above with respect to FIG. 1. For each acquisition device 110, the external trigger controller 120 includes a corresponding transceiver 128.

Each of the transceivers 128 within the external trigger controller 120 communicates with a controller/logic element 125. The controller/logic element 125 comprises, illustratively, a microprocessor-based logical element capable of implementing any of a plurality of programmable combinational and/or sequential logic functions. Such a controllable logical element may be implemented using, for example, the controller 200 of FIG. 2. Alternatively, the controller/logic element 125 comprises a preprogrammed or fixed combinational element(s) such as an AND gate, NAND, XOR and the like, and/or sequential logic element(s) such as flip-flops, shift registers and the like. In either case, the transceivers 128 within the external trigger controller 120 provide to the controller/logic element 125 respective indicium of decoded trigger states from respective acquisition devices 110.

The controller/logic element 125 processes the data received from the transceivers 128 and responsively produces an output signal indicative of such logical processing. The output signal is provided to each of the transceivers 128 for subsequent propagation back to the corresponding acquisition devices 110. In one embodiment of the invention, the controller/logic element 125 comprises an AND gate, the transceivers 128 provide a logical high signal indicative of decoded trigger events at corresponding acquisition devices 110. When all transceivers indicate respective trigger decoder events have occurred, the controller/logic element 125 responsively produces a logic high signal which is propagated back to the acquisition devices 110 via the transceivers 128. The operation of the transceivers 118 and 128 will be described in more detail below with respect to FIGS. 5–6.

Figure 5:
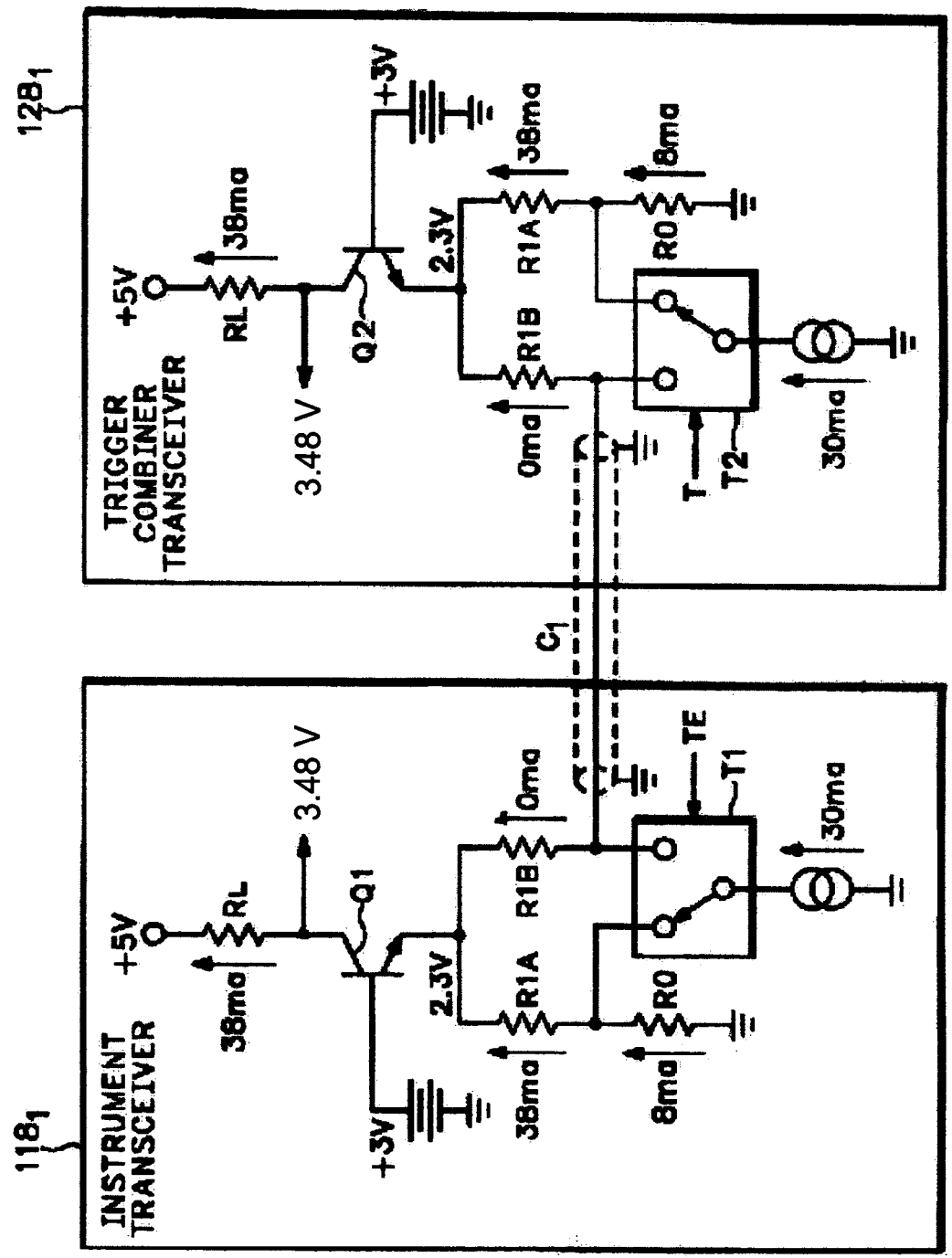
FIGS. 5–7 depict high-level block diagrams of exemplary transceivers suitable for use within the system 400 of FIG. 4.
Figure 6:
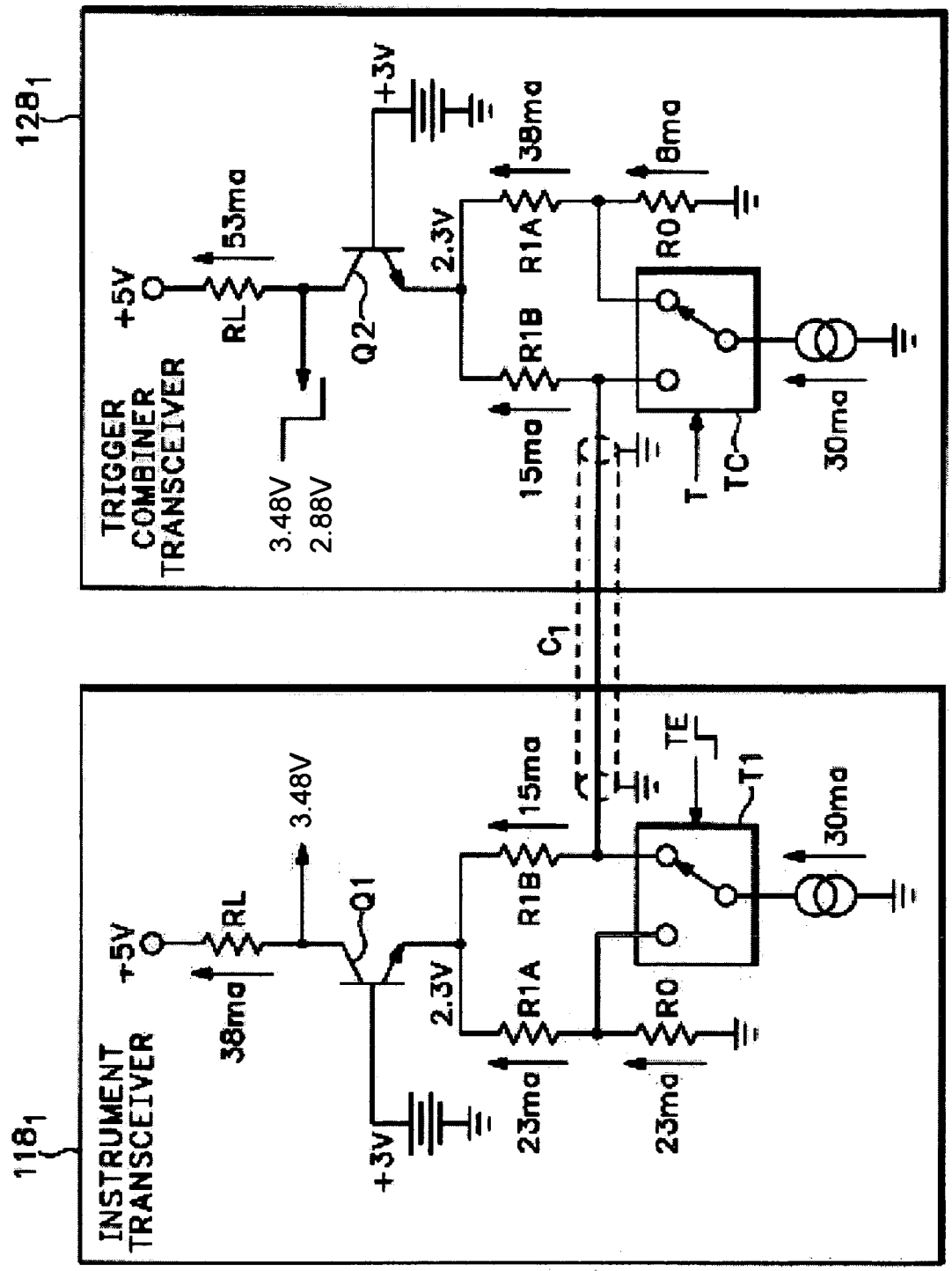

FIGS. 5–6 depict exemplary transceivers suitable for use within the system 400 of FIG. 4. Specifically, FIGS. 5–6, respectively, depict an exemplary pair of transceivers in which each of the transceivers is constructed and operates in a substantially similar manner. The two transceivers in each figure are connected via a shielded single conductor cable C1. For purposes of discussion, it will be assumed that the first transceiver is transceiver $118_1$ of the first acquisition device $110_1$ while the second transceiver is transceiver $128_1$ of the external trigger controller 120. Each transceiver is capable of assuming a normal "resting" state or an operating state. The transceiver pair of FIG. 5 is shown with both tranceivers in their normal "resting state", as will be described below.

Generally speaking, each of the transceivers comprises a series combination of a variable impedance device (a transistor), a switch and a constant energy (e.g., a constant current source). The operation of the switch in a first transceiver causes an energy perturbation in the variable impedance device of a corresponding transceiver (i.e., a second transceiver coupled by a cable or wire to the first transceiver). In the embodiment of FIG. 4, the variable impedance device comprises a transistor circuit that has a collector voltage modified in response to changes in emitter current caused by the second transceiver, thereby implementing a receive function. The switch of the first transceiver is preferably an electronically-controlled switch and is controllably operated to modify the collector voltage within a transistor circuit of the variable impedance device of the second transceiver, thereby implementing a send or transmit function. The topology of a first transceiver $118_1$ will now be discussed in detail.

First transceiver $118_1$ comprises an NPN bipolar transistor having a collector coupled to a positive voltage source V+ via a load resistor RL, a base connected to a constant DC voltage source—(shown as a 3 volt battery for simplicity), and an emitter coupled to a series combination of two resistors $R1_A$ and R0, in the order named. The emitter is also coupled to one end of a resistor R1B.

A SPDT (single pole, double throw) switch T1 has a pole connected to a constant current source $I_{cs}$, a first contact connected to the junction of resistors $R1_A$ and R0 and a second contact connected to the conducting element of cable C1. Cable C1 comprises a single conductive element preferably enclosed within a shielding means, where the shielding means is connected to ground. The single conductive element of cable C1 is coupled to the emitter of transistor Q1 via the other end of resistor $R1_B$. The other end of the single conductive element within cable C1 is connected to the same respective point in the other transceiver.

It is important to realize that transistor Q1 is arranged as a common base amplifier and, as such, acts as a constant voltage source of 2.3 volts (3 volts bias–0.7 volts base to emitter drop). Each of Resistors R0, R1A, and R1B, are preferably 50 ohms in value (or otherwise matched in value to the impedance of cable C1). The value of RL is determined by output interface requirements, but for this example is set at 40 ohms. Referring to FIG. 5, and for purposes of explanation only, assume a collector current of 38 ma through RL and note that there is zero current flowing through resistor R1B. Thus, substantially all of the 38 ma must be flowing through R1A, as shown. Further, assume that the constant current source produces 30 ma. Because the current through R1A must be the sum of the current through R0 and the current from the constant current source, then it follows that that current through R0 must be 8 ma (i.e., 38 ma–30 ma). Multiplying 50 ohms (R0) by 8 ma yields 400 mv. Multiplying 50 ohms (R1A) by 38 ma yields 1900 mv. The sum of these two voltages correctly adds up to 2.3 volts, the voltage value at the emitter. The resting current flow causes a voltage of 2.48 volts to be developed at the collector of transistor Q1. Since the trigger combiner transceiver is identical to the just-described instrument transceiver, all current and voltage values in both circuits are the same when both circuits are at rest.

The operating condition of the circuitry will now be described with respect to FIG. 6, which shows the topology described above with respect to FIG. 5. Note that a positive going signal trigger enable TE has been applied to the control terminal of the switch in the Instrument transceiver, causing the switch to change state and to connect the constant current source to the junction of the cable and R1B. At this time, the current through the series combination of R1A and R0 assumes a value equal to 23 ma (i.e., 2.3 volts divided by 100 ohms). Note that the constant current source now feeds current to two identical branches, one in each transceiver. Thus the 30 ma current from the constant current source must divide equally, providing 15 ma to each branch. In the Instrument transceiver the 23 ma current through R0 and R1A sums with the 15 ma current through R1B forming a combined current flow of 38 ma. This is exactly the same value of current that was flowing before the switch was operated! Thus, the voltage developed at the collector of the instrument transceiver does not change in response to a change of position of its own switch.

The situation is very different in the Trigger Combiner Transceiver when the switch in the Instrument Transceiver is operated, as in this example. Note that the switch in the Trigger Combiner Transceiver is in its resting position, causing 38 ma to flow through the R0 and R1A branch. An additional current of 15 ma through R1B is added by the constant current source of the Instrument transceiver through cable C1. The sum of the currents (53 ma) is passed through RL of the Trigger Combiner Transceiver causing it to develop a new lower output voltage having a level of 2.88 volts. This negative-going signal is then detected and interpreted as the receipt of a Trigger Enable signal TE from the instrument.

Figure 7:
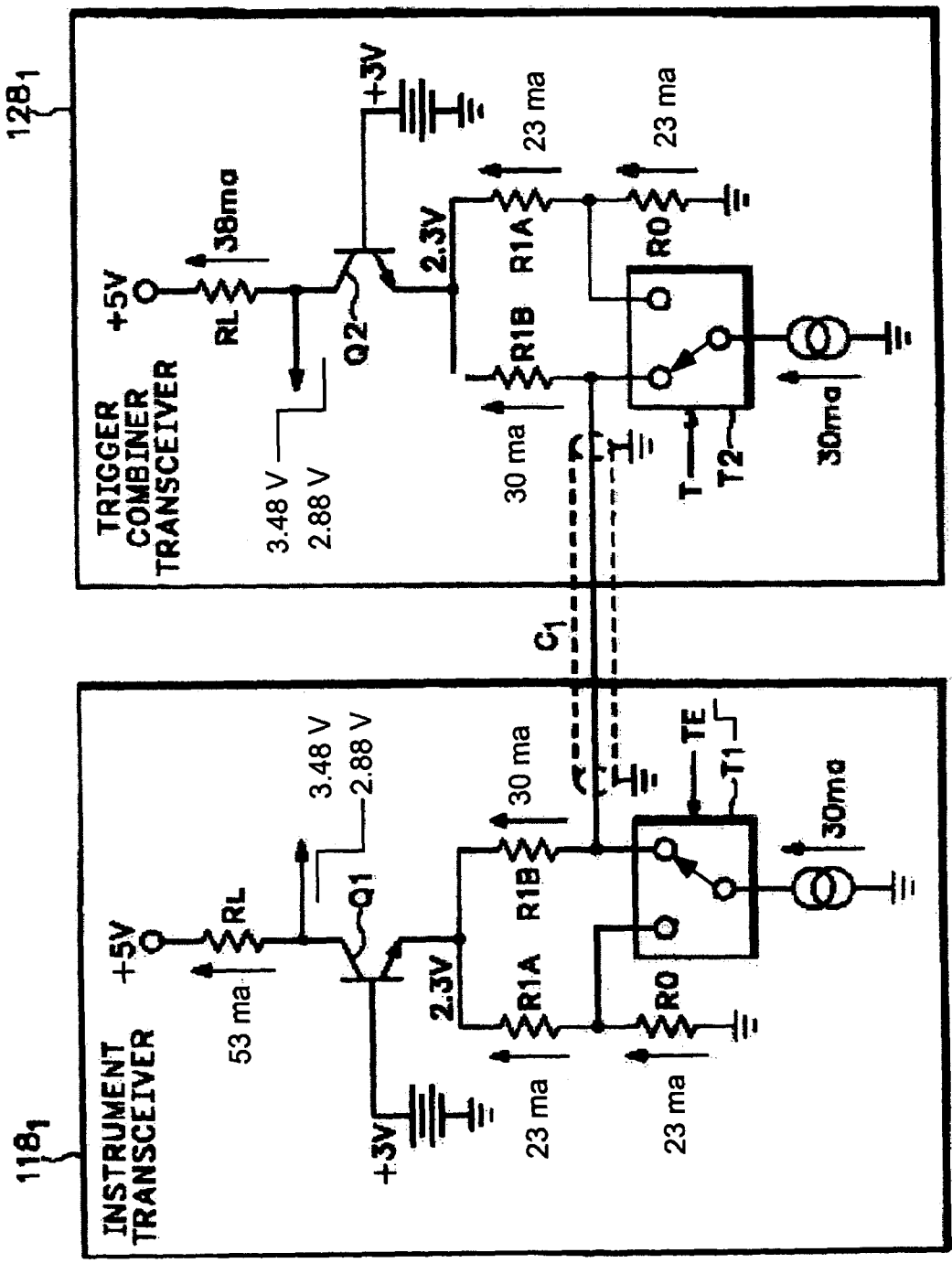

Transmission of a combined Trigger signal $T_c$ propagated in the opposite direction, is described as follows with respect to FIG. 7. The switch in the Instrument Transceiver remains in the transmit position. The switch in the Trigger Combiner Transceiver moves from its resting position to its transmitting position, causing 23 ma to flow through the R0 and R1A branch. Current though cable C1 ceases because both ends of the cable are at the same potential. This causes all of the current from each constant current source to be routed through its respective R1B branch. That is, each transceiver sees an additional current of 30 ma through R1B branch. In the Trigger Combiner Transceiver, the sum of its currents (53 ma) is passed through RL, which maintains the operating condition established by the transmission of the Trigger Enable signal. In the Instrument Transceiver, the sum of its currents (53 ma) is passed through RL, causing it to develop a new lower output voltage having a level of 2.88 volts. This negative-going signal is then detected and interpreted as the receipt of a combined Trigger signal $T_c$ from the instrument. After triggering, the transceivers then assume their respective resting states and are in a condition for handling the next trigger event.

The above-described transceivers are depicted as comprising bipolar NPN transistors arranged in a certain manner. It will be appreciated by those skilled in the art informed by the teachings of the present invention that the transceivers may be modified to use different types of transistors, such as metal oxide semiconductor field effect transistors (MOSFET) or other transistors. Essentially, the topology used to implement the transceivers 118 and 128 may be modified in a manner consistent with the teachings of the present invention to effect the functions described herein.

It will be appreciated by those skilled in the art that the transceivers and their associated operation may be applicable to systems and apparatus other than those discussed herein. That is, the transceivers have broader applicability than used with acquisition devices and external trigger controllers. The transistors may be used to effect any single wire communication between two devices and it is contemplated by the inventors that such a broad applicability of the transceivers is provided. However, the transceivers and their operation have special applicability within the context of digital storage oscilloscopes, logic analyzers and other signal acquisition/measurement devices. Within this context, it is contemplated that the standard external trigger controls of such devices be replaced or augmented by the single wire or single cable techniques discussed herein, which techniques advantageously utilize the transceiver topology also discussed herein.

While the foregoing is directed to the preferred embodiment of the present invention, other and further embodiments of the invention may be devised without departing from the basic scope thereof, and the scope thereof is determined by the claims that follow.

What is claimed is:

1. A system for triggering a plurality of test and measurement instruments substantially simultaneously, comprising:
    a first test and measurement instrument having an input for receiving a signal under test, a trigger circuit for developing a trigger signal in response to said signal under test, and a transceiver for developing a trigger enable signal in response to said trigger signal and receiving a combined trigger signal;

a second test and measurement instrument having an input for receiving a signal under test, a trigger circuit for developing a trigger signal in response to said signal under test, and a transceiver for developing a trigger enable signal in response to said trigger signal and receiving combined trigger signal; and circuitry for logically combining said trigger enable signals of said first and second test and measurement instruments to generate said combined trigger signal, the circuitry for combining having a first and second transceivers for receiving said trigger enable signals and transmitting said combined trigger signal;

wherein each of said test and measurement instruments is coupled to said circuitry for combining via a cable, said trigger enable signal and said combined trigger signal being conveyed in mutually opposite directions through said cable; and said first and second test and measurement instruments acquire data samples of said signals under test in response to said combined trigger signal.

2. The system of claim 1, wherein said transceivers comprise:
    a series combination of a variable impedance device, a switch and a constant current source; wherein:
    a junction of said variable impedance device and said switch is adapted to transmit said trigger enable signal.

3. The system of claim 2, wherein an output terminal of said variable impedance device is monitored to receive said combined trigger signal.

4. Apparatus for use in a test and measurement instrument, comprising:
    an event decoder, for monitoring at least one input signal to determine whether a logical triggering event has occurred, and generating a trigger enable signal in response thereto;
    a terminal for receiving a conductor, said conductor coupling signals between said apparatus and an external device, said conductor conveying said trigger enable signal and a trigger signal in mutually opposite directions; and
    a transceiver, coupled to said terminal, for transmitting said trigger enable signal and for receiving said trigger signal.

5. The apparatus of claim 4, wherein said test and measurement instrument further comprises an acquisition unit, for acquiring a plurality of said data samples from at least one input signal in response to said trigger signal.

6. The apparatus of claim 4, wherein said transceiver comprises:
    a series combination of a variable impedance device, a switch and a constant current source; wherein
    a junction of said variable impedance device and said switch is adapted to transmit said trigger enable signal.

7. The apparatus of claim 6, wherein:
an output terminal of said variable impedance device is monitored to receive said trigger signal.

8. The apparatus of claim 6, wherein:
said variable impedance device comprises a transistor.

9. The apparatus of claim 4, wherein:
said apparatus is used in each of a plurality of test and measurement instruments, each of said plurality of test and measurement instruments using its respective transceiver to transmit a respective trigger enable signal and to receive said trigger signal.

10. The apparatus of claim 9, wherein:
said external device is a trigger controller; and
each transceiver of each of said test and measurement instruments communicates with a corresponding transceiver in said trigger controller, said trigger controller logically combining said respective trigger enable signals to produce said trigger signal.

* * * * *